(12) United States Patent
Bao et al.

(10) Patent No.: US 11,909,441 B2
(45) Date of Patent: Feb. 20, 2024

(54) BASE STATION AND A METHOD FOR OPERATING THE BASE STATION

(71) Applicant: HUAWEI TECHNOLOGIES CO., LTD., Guangdong (CN)

(72) Inventors: Hongqiang Bao, Boulogne Billancourt (FR); Zhipeng Zhao, Shenzhen (CN); Ramin Khayatzadeh, Munich (DE); Ganghua Yang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 278 days.

(21) Appl. No.: 17/353,461

(22) Filed: Jun. 21, 2021

(65) Prior Publication Data
US 2021/0314065 A1 Oct. 7, 2021

Related U.S. Application Data

(63) Continuation of application No. PCT/EP2018/085806, filed on Dec. 19, 2018.

(51) Int. Cl.
*H04B 10/2507* (2013.01)
*H04B 10/2575* (2013.01)
*H04W 88/08* (2009.01)
*H04W 72/21* (2023.01)

(52) U.S. Cl.
CPC ... *H04B 10/2507* (2013.01); *H04B 10/25753* (2013.01); *H04W 72/21* (2023.01); *H04W 88/08* (2013.01)

(58) Field of Classification Search
None
See application file for complete search history.

(56) References Cited

U.S. PATENT DOCUMENTS

2012/0321018 A1* 12/2012 Chen ............... H03F 1/3241
375/296
2017/0093495 A1* 3/2017 Lozhkin ........... H04B 10/25753

FOREIGN PATENT DOCUMENTS

| CN | 102801462 A | 11/2012 |
| CN | 103973396 A | 8/2014 |
| EP | 2530832 A1 | 12/2012 |

OTHER PUBLICATIONS

Office Action issued in Chinese Application No. 201880100354.X dated Nov. 24, 2021, 8 pages.
Mateo et al., "Linearization of a Radio-over-Fiber Mobile Fronthaul with Feedback Loop" 26th Wireless and Optical Communication Conference (WOCC), 2017, 6 pages.

(Continued)

*Primary Examiner* — David W Lambert
(74) *Attorney, Agent, or Firm* — Fish & Richardson P.C.

(57) ABSTRACT

This application provides an example base station for an example wireless communication network and an example method. One example base station includes a central unit and a remote radio unit (RRU). The RRU includes one or more antennas. The RRU is coupled to the central unit via one or more optical transmission fibers. Each optical transmission fiber defines a respective downlink transmission channel for transmitting a respective downlink transmission signal from the central unit to the respective antenna of the RRU. The RRU is configured to provide a respective uplink feedback signal based on the respective downlink transmission signal via an uplink feedback channel to the central unit.

14 Claims, 12 Drawing Sheets

(56) References Cited

OTHER PUBLICATIONS

Morgan et al, "A Generalized Memory Polynomial Model for Digital Predistortion of RF Power Amplifiers" IEEE Transactions on Signal Processing, vol. 54, No. 10, Oct. 2006, 9 pages.
Chani-Cahuana et al, "Iterative Learning Control for RF Power Amplifier Linearization" IEEE Transactions on Microwave Theory and Techniques, vol. 64, No. 9, Sep. 2016, 12 pages.
Hekkala et al., "Predistortion of Radio Over Fiber Links: Algorithms, Implementation, and Measurements" IEEE Transactions on Circuits and Systems I: Regular Papers, vol. 59, No. 3, Mar. 2012, 9 pages.
Hekkala et al., "Architectures for Joint Compensation of RoF and PA with Nonideal Feedback" 2010, 5 pages.
Tien Dat et al., "5G Transport and Broadband Access Networks: The Need for New Technologies and Standards" ITU Kaleidoscope 2015 Trust in the Information Society, Barcelona, Spain, Dec. 9-11, 2015, 16 pages.
Bergmann et al., "Dispersion-Induced Composite Second-Order Distortion at 1.5um" IEEE Photonics Technology Letters, vol. 3, No. 1, Jan. 1991, 3 pages.
PCT International Search Report and Written Opinion in International Application No. PCT/EP2018/085806, dated Jul. 3, 2019, 12 pages.

\* cited by examiner

BASE STATION AND A METHOD FOR OPERATING THE BASE STATION

CROSS-REFERENCE TO RELATED APPLICATIONS

This application is a continuation of International Application No. PCT/EP2018/085806, filed on Dec. 19, 2018, the disclosure of which is hereby incorporated by reference in its entirety.

TECHNICAL FIELD

In general, the present disclosure relates to the field of wireless communications. More specifically, the present invention relates to a base station and a method for operating the base station.

BACKGROUND

An important technology for 5G communication networks and systems is massive Multi-input Multi-output (MIMO), where a MIMO base station may have up to hundreds of antennas for communicating with user equipment(s). Normally, the plurality of antennas of a MIMO base station (also referred to as "base transceiver station") are part of a remote radio unit (RRU), which can be connected via a plurality of radio frequency (RF) communication channels to a central unit of the MIMO base station for receiving a respective transmit signal to be transmitted by the respective antenna. As the RRU of a MIMO base station has often be installed on an outdoor pole or mast, the weight of a RRU should advantageously not exceed certain limits, such as 20 kilograms, so that the RRU can still be manually moved easily.

For providing the respective RF communication channel between the central unit and the respective antenna of the RRU of the MIMO base station usually optical fiber transmission technology (also referred to as "Radio over Fiber (RoF)") is employed. In a RoF system, the radio signal is used for modulating the intensity of an optical carrier. This technique of transmitting the RF signals using an optical carrier over the fiber has numerous advantages over conventional copper wire solutions, such as low attenuation loss, large bandwidth, and reduced power consumption to name a few.

There are two main types of Radio over Fiber (RoF) communications systems, namely analog RoF systems and digital, i.e. digitized RoF systems. In an analog RoF system, the RRU can have a relatively simple structure having a RoF interface and a power amplifier (PA) as the main components for each antenna, because an analog-to-digital converter (ADC) and a digital-to-analog converter (DAC) can be implemented as parts of the central unit. FIG. 1 shows a base station 100 implementing a conventional analog RoF system. The base station 100 comprises a central unit 110, which can be connected via a plurality of optical fibers 130a, 130b to the respective antennas 123a, 123b of a RRU 120. For each antenna 123a, 123b, the RRU 120 comprises a RoF interface (e.g. electronic-to-optical converters or vice versa) 121a, 121b and a power amplifier 122a, 122b. The central unit 110 comprises digital signal processing circuitry 111 and for each optical fiber 130a, 130b a digital pre-distorter 112a, 112b, an ADC/DAC unit 113a, 113b and a RoF interface 114a, 114b.

One of the major challenges for an analog RoF system is an increased nonlinearity of the system for long distance transmissions (e.g. a chromatic dispersion effect in a long optical fiber having an exemplary length of 20 Km), which results in severe distortions of the output signal as well as higher out-of-band signal power, as illustrated by the following example for an analog RoF system with the following parameters: OFDM (orthogonal frequency division multiplexing) baseband width of 200 MHz, a radio frequency of 3.5 GHz, a single optical fiber of length 20 Km for a single RF channel, wherein the downlink optical wavelength is 1550 nm and the uplink wavelength is 1310 nm, a directly modulated laser (DML). For this example, the single link performance ACPR (adjacent channel power ratio), which represents the out-of-band signal power in the spectral domain, is degraded by about 7-9 dBc due to the combined effect of laser chirp and optical fiber dispersion.

There have been some attempts to compensate these downlink nonlinearities using conventional digital pre-distortion. Moreover, post-distortion can help to improve the uplink performance. These attempts, however, require equipment for providing a training signal, which increases the hardware requirements and, thus, the size and weight of the RRU.

FIG. 2 shows an example of a conventional base station 200, where the RRU 220 comprises a unit 226 for providing a training signal to the central unit 210, which is connected by an optical downlink fiber 230a and an optical uplink fiber 230b with the RRU 220. Similar to the conventional base station 100 shown in FIG. 1, the RRU 220 comprises RoF interfaces 221a, 221b, a power amplifier 222a, an antenna 223 and a coupler 225 for coupling the downlink transmission channel to the uplink transmission channel. The central unit 210 of the base station 200 shown in FIG. 2 comprises digital signal processing circuitry 211 for generating a digital signal, a digital pre-distorter (DPD) 212a, an ADC unit 213a, 113b, a DAC unit 213b, a post-distorter (PD) 212b and RoF interfaces 214a, 214b.

FIG. 3 illustrates in more detail a possible implementation of the unit 226 of the RRU 220 for providing a training signal. Typically, the training signal generation by the RRU 220 is realized by a digital baseband signal generator 226d, a DAC 226b, and a RF modulator, whose frequency is synchronized with the demodulation frequency of the central unit 210. Moreover, the unit 226 typically further includes a digital up-converter (DUC) 226c. As will be appreciated, all of these components generally will add to the costs, size and weight of the RRU 220.

Thus, there is a need for an improved base station with a central unit and a remote radio unit, wherein the improved base station at last partially mitigates the problems of conventional base stations associated with the analog transmission over long optical fibers and, thus, allows improving system performance with as few additional hardware components as possible.

SUMMARY

An object of the embodiments of the invention to provide an improved base station with a central unit and a remote radio unit. The improved base station at least partially mitigates the problems of conventional base stations associated with the analog transmission over long optical fibers and, thus, allows improving system performance with as few additional hardware components as possible.

The foregoing and other objects are achieved by the subject matter of the independent claims. Further implementation forms are apparent from the dependent claims, the description and the figures.

More specifically, according to a first aspect, the invention relates to a base station (also referred to as "base transceiver station") for a wireless communication network. The base station comprises: a central unit; and a remote radio unit, RRU, comprising one or more antennas for over-the-air communication. The central unit is configured to connect to a radio access network of the wireless communication network. The RRU is coupled to the central unit via one or more optical transmission fibers. Each optical transmission fiber defines a respective downlink transmission channel for transmitting a respective downlink transmission signal from the central unit to the respective antenna of the RRU. The RRU is configured to provide a respective uplink feedback signal via an uplink feedback channel to the central unit for (e.g. iteratively) reducing non-linear distortion of the respective downlink transmission signal. The respective uplink feedback signal is based on the respective downlink transmission signal.

The problems of conventional base stations associated with the analog transmission over long optical fibers is at least partially mitigated and, system performance is thus improved.

In a further possible implementation form of the first aspect, the base station comprises a coupler configured to for example, individually couple a respective downlink transmission channel with the uplink feedback channel for providing the respective uplink feedback signal via an uplink feedback channel to the central unit.

By using the coupler, the uplink feedback channel can be shared by the one or more downlink transmission channels for reducing non-linear distortion of each downlink transmission signal. Just as an example, the coupler may be implemented by a time-multiplexer.

In a further possible implementation form of the first aspect, the central unit comprises an adjustable digital pre-distorter (e.g. pre-distortion filter) configured to pre-distort the respective downlink transmission signal to be transmitted to the respective antenna of the RRU on the basis of the respective uplink feedback signal.

By using the adjustable digital pre-distorter, the non-linear distortion in each downlink transmission signal can be compensated.

In a further possible implementation form of the first aspect, the adjustable digital pre-distorter is configured to pre-distort the respective downlink transmission signal to be transmitted to the respective antenna of the RRU on the basis of the respective uplink feedback signal such that non-linear distortions of the respective downlink transmission signal caused by the respective downlink transmission channel are at least partially reduced.

In a further possible implementation form of the first aspect, the central unit is configured to transmit a respective training signal via the respective downlink transmission channel to the respective antenna of the RRU (e.g. when the adjustable pre-distorter is disabled) and to adjust, e.g. train the adjustable digital pre-distorter on the basis of the respective uplink feedback signal. The respective uplink feedback signal is based on the respective training signal and the respective uplink feedback signal is provided via the uplink feedback channel.

By using a training signal for each downlink transmission channel, non-linear character (e.g. parameters) of each downlink transmission channel can be estimated. Just for example, the parameters may be obtained by using a linearization algorithm module. The parameters are used for compensating for compensating the adjustable digital pre-distorter.

In a further possible implementation form of the first aspect, the central unit is configured to adjust the adjustable digital pre-distorter using an iterative adjustment scheme.

By adjusting the digital pre-distorter in an iterative way, the performance of the base station is thus improved.

In a further possible implementation form of the first aspect, the base station is configured to operate the uplink feedback channel in an ideal or quasi-ideal regime (or mode). In other words, according to embodiments of the uplink feedback channel is configured to induce at most linear distortions of the respective uplink feedback signal.

In a further possible implementation form of the first aspect, the RRU is further configured to reduce a signal strength of the respective uplink feedback signal for operating the uplink feedback channel in the linear regime (or linear mode), in which the distortion of the uplink signal is kept within linear boundaries.

In a further possible implementation form of the first aspect, the base station further comprises a frequency converter. The frequency converter is configured to frequency down-convert the respective uplink feedback signal for operating the uplink feedback channel in the linear regime. In an implementation form the respective uplink feedback signal provided by the respective RRU can have frequencies in the GHz range, while the respective frequency down-converted uplink feedback signal has frequencies in the MHz range for operating the uplink feedback channel in the linear regime.

In a further possible implementation form of the first aspect, the central unit further comprises a digital-to-analog converter for converting the respective downlink transmission signal to be transmitted to the respective antenna of the RRU from the digital domain to the analog domain.

By converting the respective downlink transmission signal from the digital domain to the analog domain, the respective downlink transmission signal can be transmitted in the analog RoF, and the complexity of implementation of the base station is thus reduced.

In a further possible implementation form of the first aspect, the RRU further comprises for each antenna, a power amplifier configured to amplify the respective downlink transmission signal received from the central unit.

In a further possible implementation form of the first aspect, the optical transmission fiber defines the respective downlink transmission channel and the uplink feedback channel between the RRU and the central unit. In other words, according to an implementation form, the respective downlink transmission channel and uplink feedback channel may be logical channels of the optical transmission fiber.

In a further possible implementation form of the first aspect, the optical transmission fiber further defines an uplink transmission channel between the RRU and the central unit. In other words, according to an implementation form the respective downlink transmission channel and uplink transmission channel can be logical channels of the optical transmission fiber.

In a further possible implementation form of the first aspect, the base station comprises a further optical transmission fiber defining the uplink feedback channel between the RRU and the central unit. In other words, according to an implementation form the respective downlink transmission channel can be a logical channel of the optical transmission fiber and the uplink feedback channel can be a logical channel of the further optical transmission fiber.

According to a second aspect the invention relates to a method of operating a base station according to the first aspect of the invention. The method comprises the steps of:

transmitting a respective downlink transmission signal from the central unit to the respective antenna of the RRU of the base station; and providing a respective uplink feedback signal based on the respective downlink transmission signal via the uplink feedback channel to the central unit for iteratively reducing non-linear distortions of the respective downlink transmission signal.

The method according to the second aspect of the invention can be performed by the base station according to the first aspect of the invention. Further features of the method according to the second aspect of the invention result directly from the functionality of the base station according to the first aspect of the invention and its different implementation forms described above and below.

According to a third aspect the invention relates to a computer program product comprising program code for performing the method of the second aspect when executed on a computer or a processor.

The invention as well as components thereof can be implemented in hardware, software or a combination of hardware and software.

BRIEF DESCRIPTION OF THE DRAWINGS

In the following embodiments of the invention are described in more detail with reference to the attached figures and drawings, in which.

In the following identical reference signs refer to identical or at least functionally equivalent features.

DETAILED DESCRIPTION OF THE EMBODIMENTS

In the following description, reference is made to the accompanying figures, which form part of the disclosure, and which show, by way of illustration, specific aspects of embodiments of the invention or specific aspects in which embodiments of the present invention may be used. It is understood that embodiments of the invention may be used in other aspects and comprise structural or logical changes not depicted in the figures. The following detailed description, therefore, is not to be taken in a limiting sense, and the scope of the present invention is defined by the appended claims.

For instance, it is understood that a disclosure in connection with a described method may also hold true for a corresponding device or system configured to perform the method and vice versa. For example, if one or a plurality of specific method steps are described, a corresponding device may include one or a plurality of units, e.g. functional units, to perform the described one or plurality of method steps (e.g. one unit performing the one or plurality of steps, or a plurality of units each performing one or more of the plurality of steps), even if such one or more units are not explicitly described or illustrated in the figures. On the other hand, for example, if a specific apparatus is described based on one or a plurality of units, e.g. functional units, a corresponding method may include one step to perform the functionality of the one or plurality of units (e.g. one step performing the functionality of the one or plurality of units, or a plurality of steps each performing the functionality of one or more of the plurality of units), even if such one or plurality of steps are not explicitly described or illustrated in the figures. Further, it is understood that the features of the various exemplary embodiments and/or aspects described herein may be combined with each other, unless specifically noted otherwise.

Figure 4:
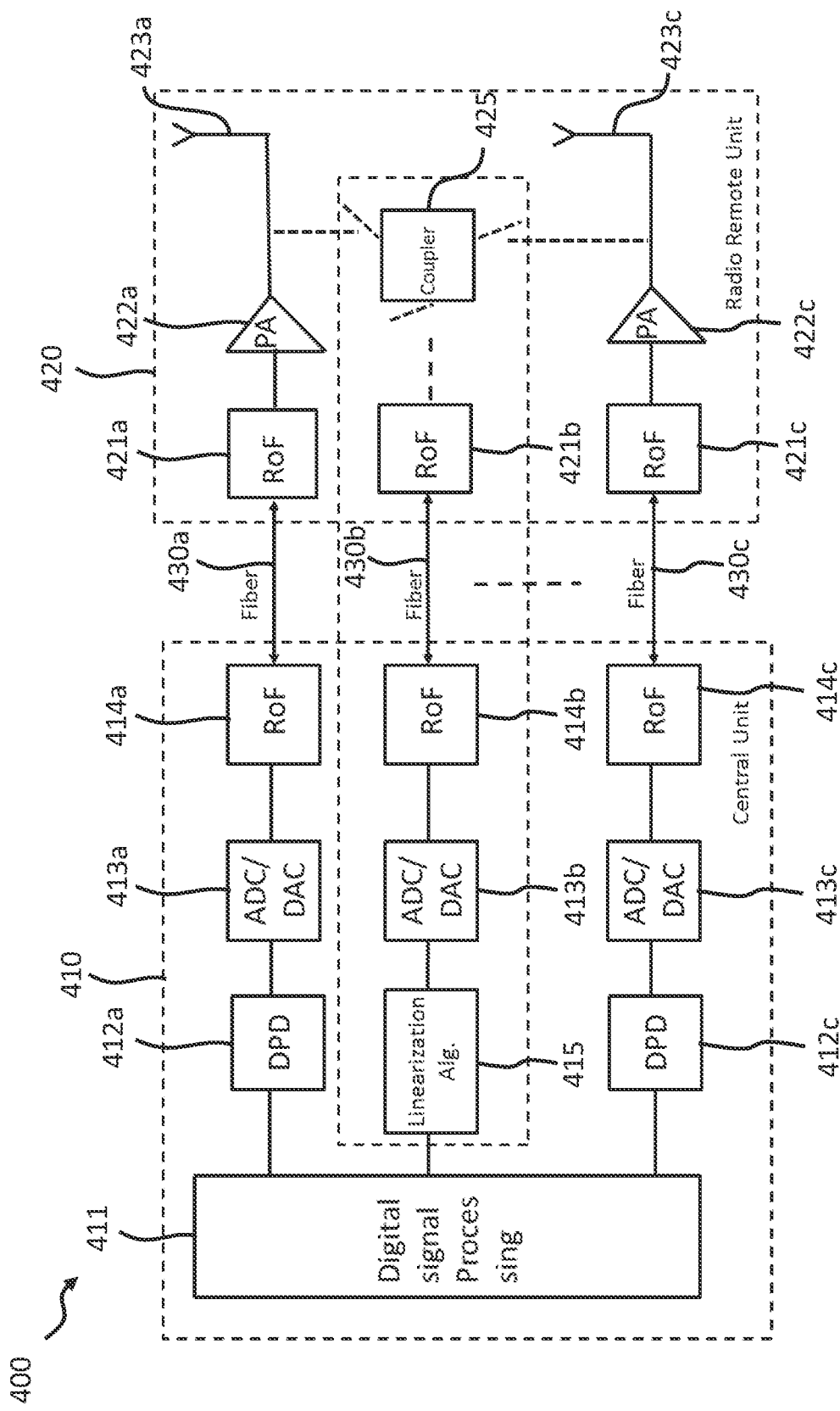
FIG. 4 shows a schematic diagram illustrating a base station according to an embodiment.

FIG. 4 shows a base station 400 according to an embodiment. The base station 400 is configured to communicate with one or more user equipments (UEs) and could be employed as part of a radio access network (RAN) of a wireless communication network, such as a 5G communication network.

The base station 400 comprises a central unit 410, which may be coupled to the RAN of a wireless communication network. Moreover, the base station 400 comprises a remote radio unit (RRU) 420 comprising one or more antennas 423a, 423c for over-the-air communication with one or more UEs. In the case the base station 400 is implemented as a MIMO base station 400, and the RRU 420 may comprise up to hundreds of antennas 423a, 423c.

Each antenna 423a, 423c of the RRU 420 is coupled to the central unit 410 via an optical transmission fiber 430a, 430c. Each optical transmission fiber 430a, 430c defines a respective downlink transmission channel for transmitting a respective downlink transmission signal from the central unit to the respective antenna 423a, 423c of the RRU 420.

Figure 1:
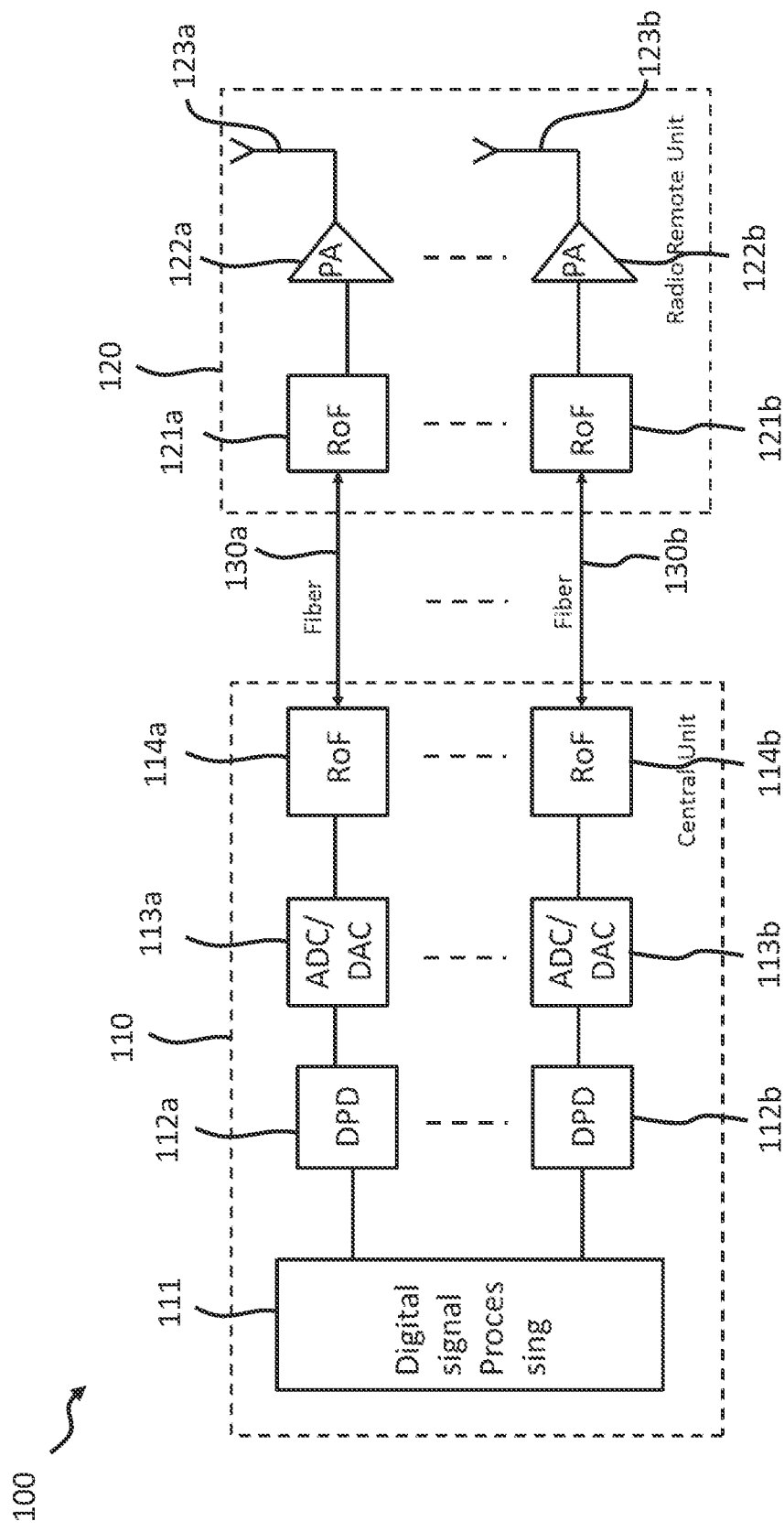
FIG. 1 shows a schematic diagram illustrating a base station implementing an analog RoF system.
Figure 2:
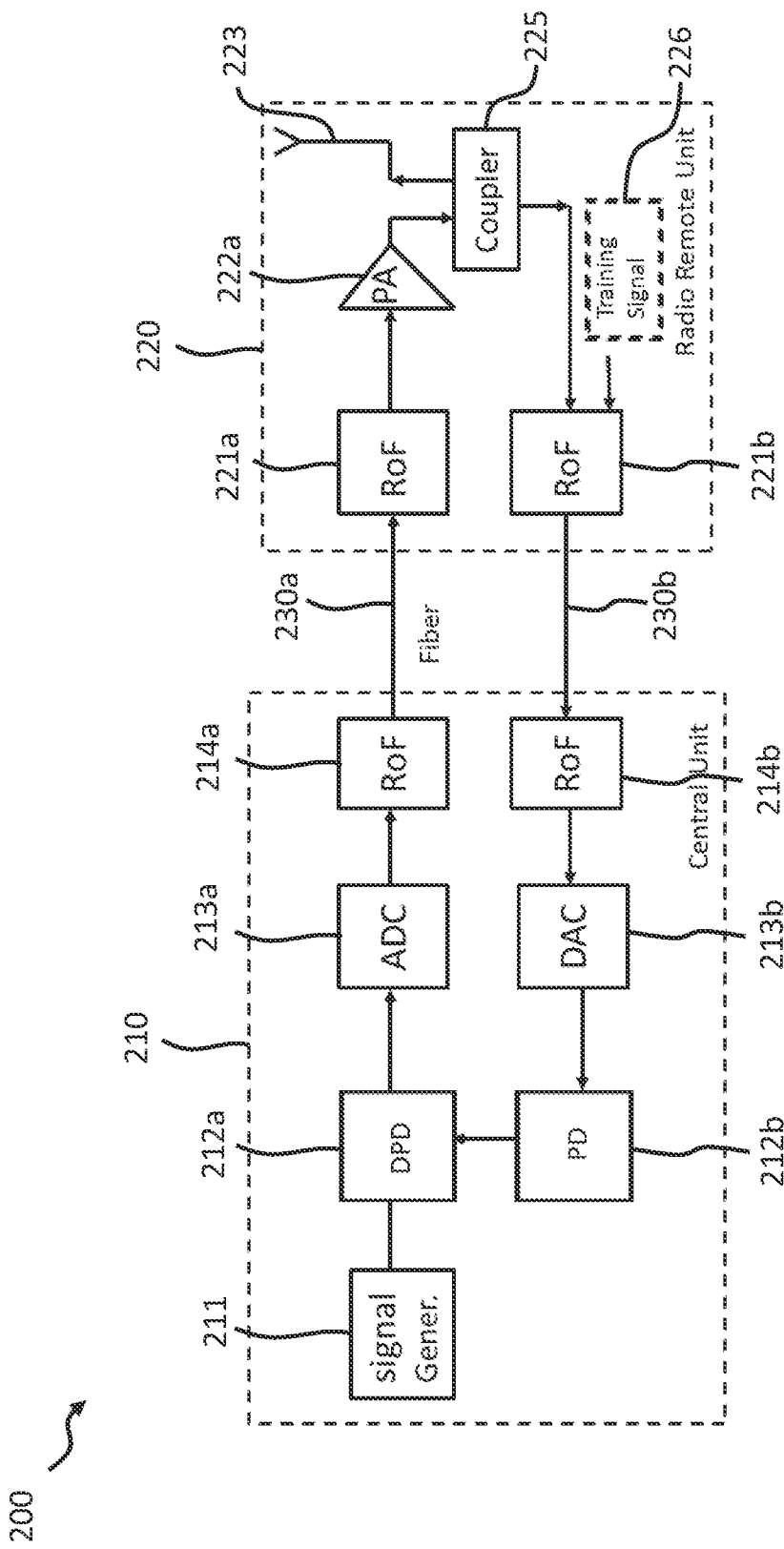
FIG. 2 shows a schematic diagram illustrating a base station implementing an analog RoF system and comprising a unit for generating a training signal.
Figure 3:
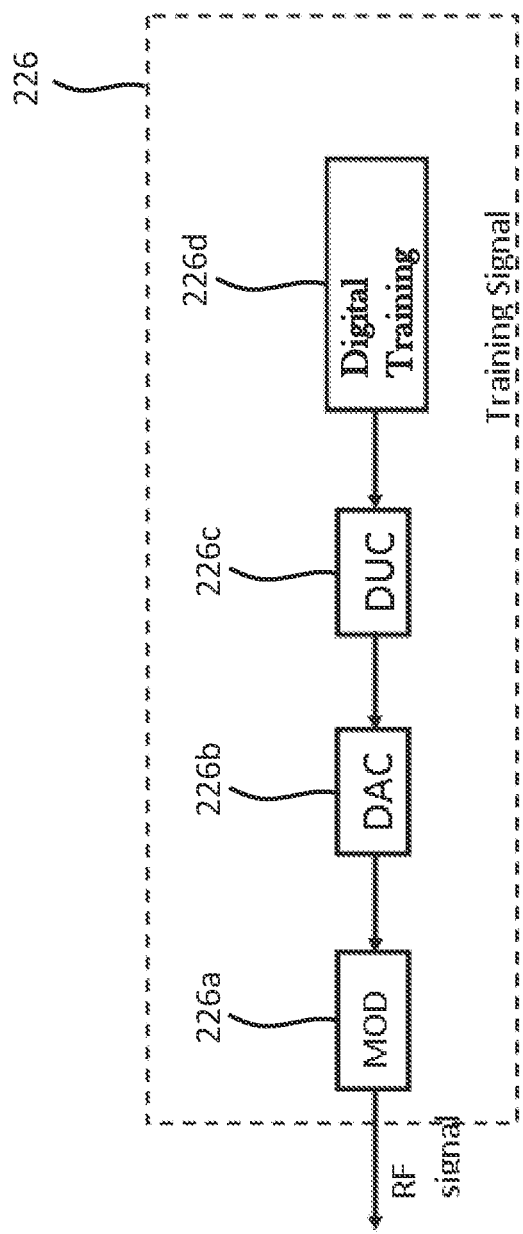
FIG. 3 shows a schematic diagram illustrating more details of the unit for generating a training signal of the base station of FIG. 2.

As illustrated in FIG. 4, similar to the conventional base station 100 shown in FIG. 1, the central unit 410 of the base station 400 may comprise digital signal processing circuitry 411 and for each optical transmission fiber 430a, 430c (e.g. each downlink transmission channel 430a, 430c), a digital pre-distorter (e.g. a pre-distortion filter 412a, 412c), an ADC/DAC unit 413a, 413c and a RoF interface (e.g. an electronic-to-optical and/or optical-to-electronic converter) 414a, 414c. Likewise, similar to the conventional base station 100 shown in FIG. 1, for each antenna 423a, 423c, the RRU 420 of the base station 400 may comprise a RoF interface (e.g. an electronic-to-optical and/or optical-to-electronic converter) 421a, 421c and a power amplifier 422a, 422c. According to embodiments of the invention, the base station 400 is a massive MIMO base station 400 having, for instance, 64 or more transmission channels 430a, 430c and antennas 423a, 423c.

As will be described in more detail further below, the RRU 420 is configured to provide a respective uplink feedback signal via a dedicated uplink feedback channel 430b to the central unit 410 for reducing non-linear distortions of the respective downlink transmission signal. The respective uplink feedback signal is based on the respective downlink transmission signal. As illustrated in FIG. 4, the dedicated uplink feedback channel 430b may be for example, provided by a dedicated optical transmission fiber 430b. According to further embodiments of the invention, the dedicated uplink feedback channel may be for example, a logical channel of one of the optical transmission fibers 430a, 430c.

Thus, compared to the conventional base station 100 shown in FIG. 1, in the base station 400 illustrated in FIG. 4, the dedicated uplink feedback channel 430b is added as an additional transmission channel. The additional transmission channel is dedicated to feedback to the central unit 410 of the base station 400 non-linearities induced by the respective downlink data transmission channel 430a. 430c. The optical transmission fibers 430a. 430c provides the downlink data transmission channels 430a, 430c of the base station 400. The optical transmission fibers 430a, 430c may operate in the same way as the optical transmission fibers 130a, 130b coupling the plurality of antennas 123a, 123b of the RRU 120 to the central unit 110 of the conventional base station 100 shown in FIG. 1. However, according to the present embodiment of the invention, the dedicated feedback channel 430b of the base station 400 illustrated in FIG. 4 allows to couple each of the downlink data transmission channels 430a, 430c (or equivalently the corresponding antennas 423a, 423c) to the central unit 410 of the base station 400 by means of a respective uplink feedback signal and, then, to iteratively reduce non-linear distortions of the respective downlink transmission signal. To this end, as illustrated in FIG. 4, the central unit 410 of the base station 400 may further comprise a processing unit 415 implementing a linearization algorithm, which can be considered to be a kind of post-distorter and will be described in more detail below. For supporting the dedicated uplink feedback channel 430b the base station 400 may further comprise, on the side of the central unit 410, a ADC/DAC unit 413b and a RoF interface (e.g. an electronic-to-optical and/or optical-to-electronic converter) 414b as well as a corresponding RoF interface (e.g. an electronic-to-optical and/or optical-to-electronic converter) 421b on the RRU side.

As illustrated in FIG. 4, the base station 400 may further comprise a coupler 425 configured to for example, individually couple a currently selected downlink data transmission channel, such as the data transmission channel 430a, or equivalently a currently selected one of the plurality of antennas 423a, 423c of the RRU 420 via the uplink feedback channel 430b with the central unit 410 for providing the respective uplink feedback signal to the central unit 410 based on the respective downlink transmission signal received via the currently selected downlink transmission channel 430a, 430c. Thus, according to an embodiment, the coupler 425 can operate like a switch.

According to an embodiment, the central unit 410 and the RRU 420 of the base station 400 are configured to communicate using a Time Division Duplex (TDD) communication mode and/or a Frequency Division Duplex (FDD) communication mode. In the TDD mode, the feedback channel can be shared by uplink user receiver and observer receiver, but in the FDD mode, feedback channels should be dedicated, so this method is useful for sharing feedback channels. Thus, according to embodiments of the invention, the dedicated uplink feedback channel 430b can be separated from the data receiving uplink channels.

According to an embodiment, the respective adjustable pre-distorter (e.g. pre-distortion filter 412a, 412c of the central unit 410) is configured to pre-distort the respective downlink transmission signal to be transmitted via the respective downlink transmission channel 430a, 430c to the respective antenna 423a, 423c of the RRU 420 on the basis of the respective uplink feedback signal received by the central unit 410 via the dedicated uplink feedback channel 430b. Hence, non-linear distortions of the respective downlink transmission signal caused by the respective downlink transmission channel 430a, 430c are at least partially reduced.

As the dedicated uplink feedback channel 430b might introduce some non-linearities itself, according to an embodiment, the base station 400 is configured to operate the dedicated uplink feedback channel 430b in an ideal, i.e. linear or quasi-ideal, i.e. quasi-linear regime (or mode). In the following further embodiments of the base station 400 will be described in the context of FIG. 5, which are based on the idea(s) (i) to control the uplink feedback channel transmission power and/or (ii) to use an intermediate frequency band for transmitting the uplink feedback signal over the dedicated uplink transmission channel 430b for operating the dedicated uplink feedback channel 430b in an ideal or quasi-ideal regime (or mode).

Figure 5:
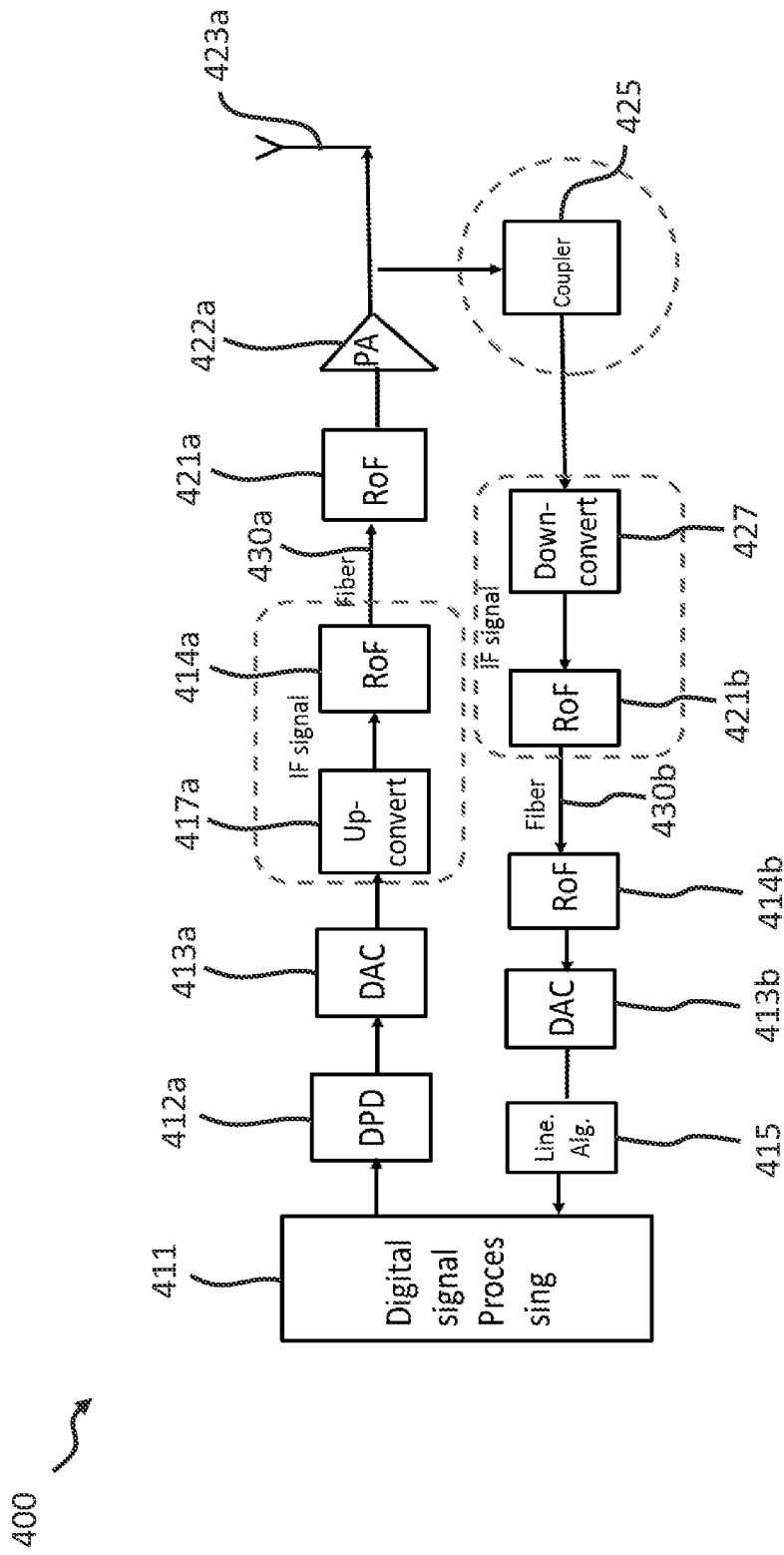
FIG. 5 shows a schematic diagram illustrating a base station according to an embodiment.

In the embodiment of the base station 400 shown in FIG. 5, the coupler 425 can be configured not only to individually couple the currently selected downlink data transmission channel 430a, 430b via the uplink feedback channel 430b with the central unit 410, but also to reduce the power (e.g. the signal strength of the uplink feedback signal), as illustrated in FIG. 5. Additionally or alternatively, the base station 400 can further comprise a frequency converter 427 configured to frequency down-convert the uplink feedback signal to an intermediate frequency (IF). As illustrated in FIG. 5, the frequency convertor 427 may be located between the coupler 425 and the RoF interface 421b of the dedicated uplink feedback channel 430b. According to an embodiment, the respective uplink feedback signal provided by the coupler 425 of the RRU 420 may have frequencies in the GHz range, such as 3.5 GHz, while due to the frequency convertor 427 the respective frequency down-converted uplink feedback signal, i.e. the IF signal may have frequencies in the MHz range, such as 700 MHz. As will be appreciated, the IF signal having, for instance, a frequency of 700 MHz has a better linearity than the uplink feedback signal having, for instance, a frequency of 3.5 GHz. However, according to embodiments of the invention it is also possible to have an uplink feedback signal with a frequency of 900 MHz without frequency down-conversion to an intermediate frequency.

Figure 6:
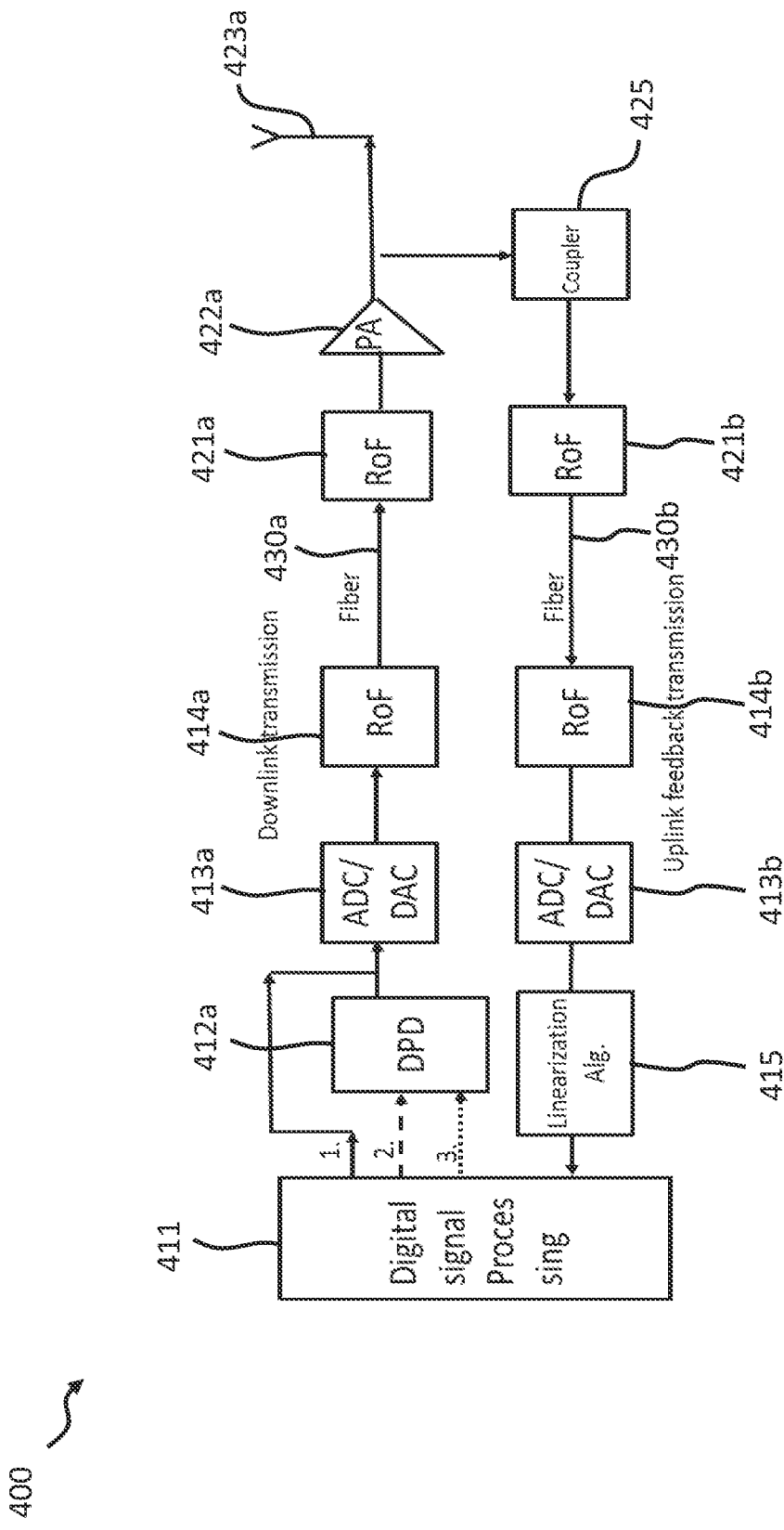
FIG. 6 shows a schematic diagram illustrating a base station according to an embodiment.

FIG. 6 illustrates in more detail an embodiment of how the uplink feedback signal may be used by the central unit 410 of the base station 400 for reducing non-linear distortions. In a first stage a training signal is generated by the digital signal processing circuitry 411 and transmitted via the currently selected downlink transmission channel 430a to the RRU 420. The coupler 425 of the RRU couples the currently selected downlink transmission channel 430a to the dedicated uplink feedback channel 430b. As already described above, for reducing any further non-linearities induced by the dedicated uplink feedback channel 430b the coupler 425 may be configured to reduce the signal power for operating in the linear domain. Further linearization may be achieved by the unit 415 implementing a linearization algorithm, as will be described in more detail below. According to an embodiment, the currently selected downlink transmission channel 430a may be described by a system or channel model, in particular a polynomial system model defined by a plurality of polynomial coefficients, such as the Generalized Memory Polynomial. These polynomial coefficients are determined by the central unit 410 on the basis of the feedback to the training signal received via the dedicated uplink feedback channel 430b and provided to the adjustable pre-distorter 412a implementing a pre-distortion filter (see second step). Once the base station 400 has been trained in this way to adjust for the non-linearities induced by the currently selected downlink transmission channel 430a, the digital signal processing circuitry 411 may start sending data transmission signals to the adjustable pre-distorter 412 to be transmitted via the currently selected downlink transmission channel 430a to the RRU 420. As all downlink transmission channels 430a, 430c may be different, the above steps can be repeated for each downlink transmission channel 430a. 430c.

Figure 7:
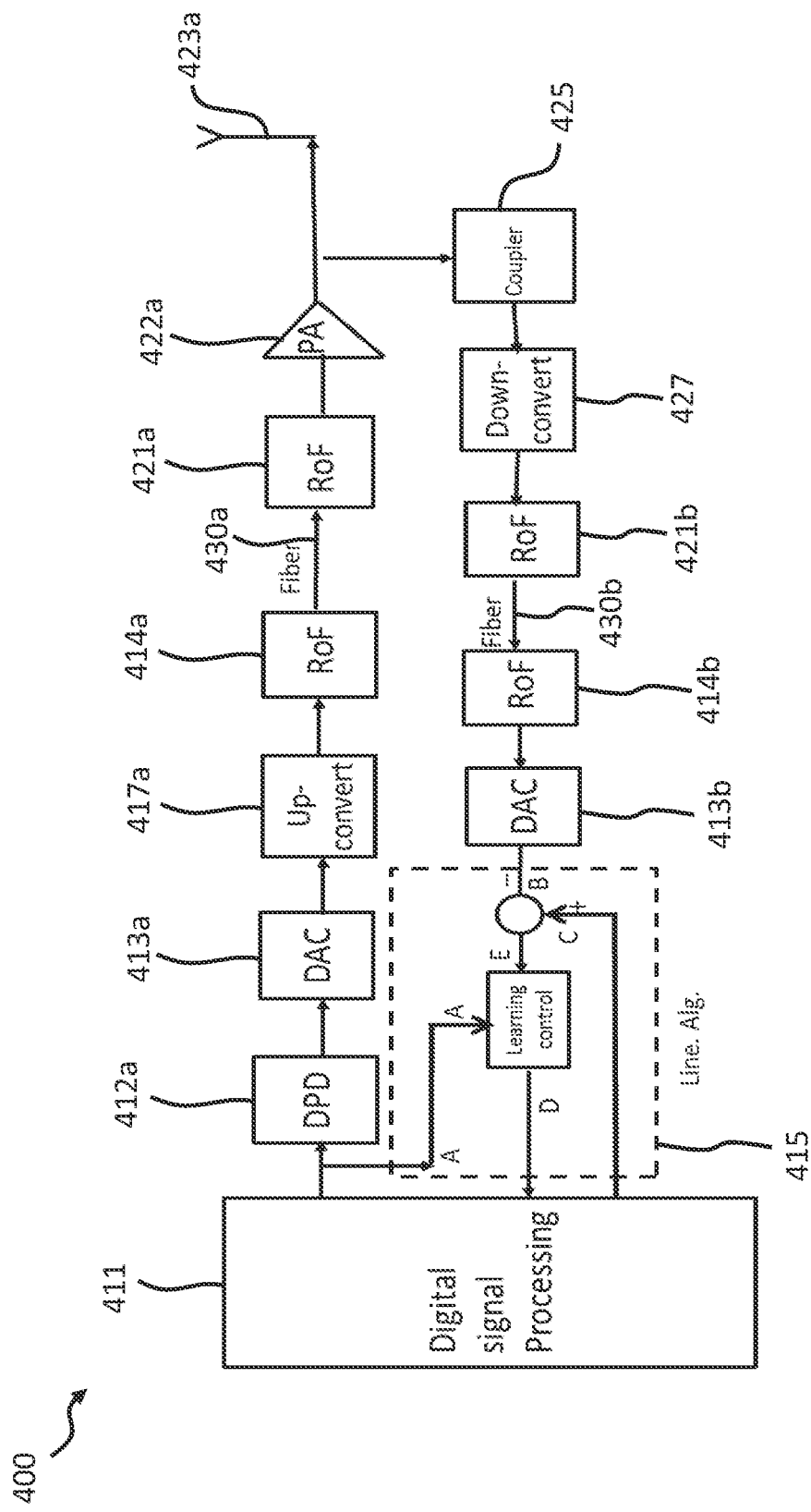
FIG. 7 shows a schematic diagram illustrating a base station according to an embodiment.

FIG. 7 illustrates in more detail an embodiment of how the unit 415 implementing the linearization algorithm can provide for further linearization. As can be taken from FIG. 7, an input signal A is generated by the digital signal processing circuitry 411 and provided to the unit via two communication paths, namely (a) and (b) via the currently selected downlink transmission channel 430a, the coupler 425 and the dedicated uplink feedback channel 430b (whereby the input signal A is distorted/processed into the input signal B). Moreover, the digital signal processing circuitry 411 provides the desired signal C to the unit 415. The desired signal C can be the linearized version of the input signal A and it can be fixed if the system does not change over time. E is the error signal between the desired signal C and B. The unit 415 may be configured to use the error signal weighted E plus the input signal A, to get the output signal D. In the next iteration, the unit 415 can use the output signal D as the new input signal, i.e. to replace the input signal A, in order to get a smaller error signal E. Usually, after several iterations the error signal will converge to zero. In this case, the system can be considered to be linearized, and the signal B is close to linearized version. According to an embodiment, the unit 415 may define the number of iterations and/or the weights for determining the error signal E.

Figure 8:
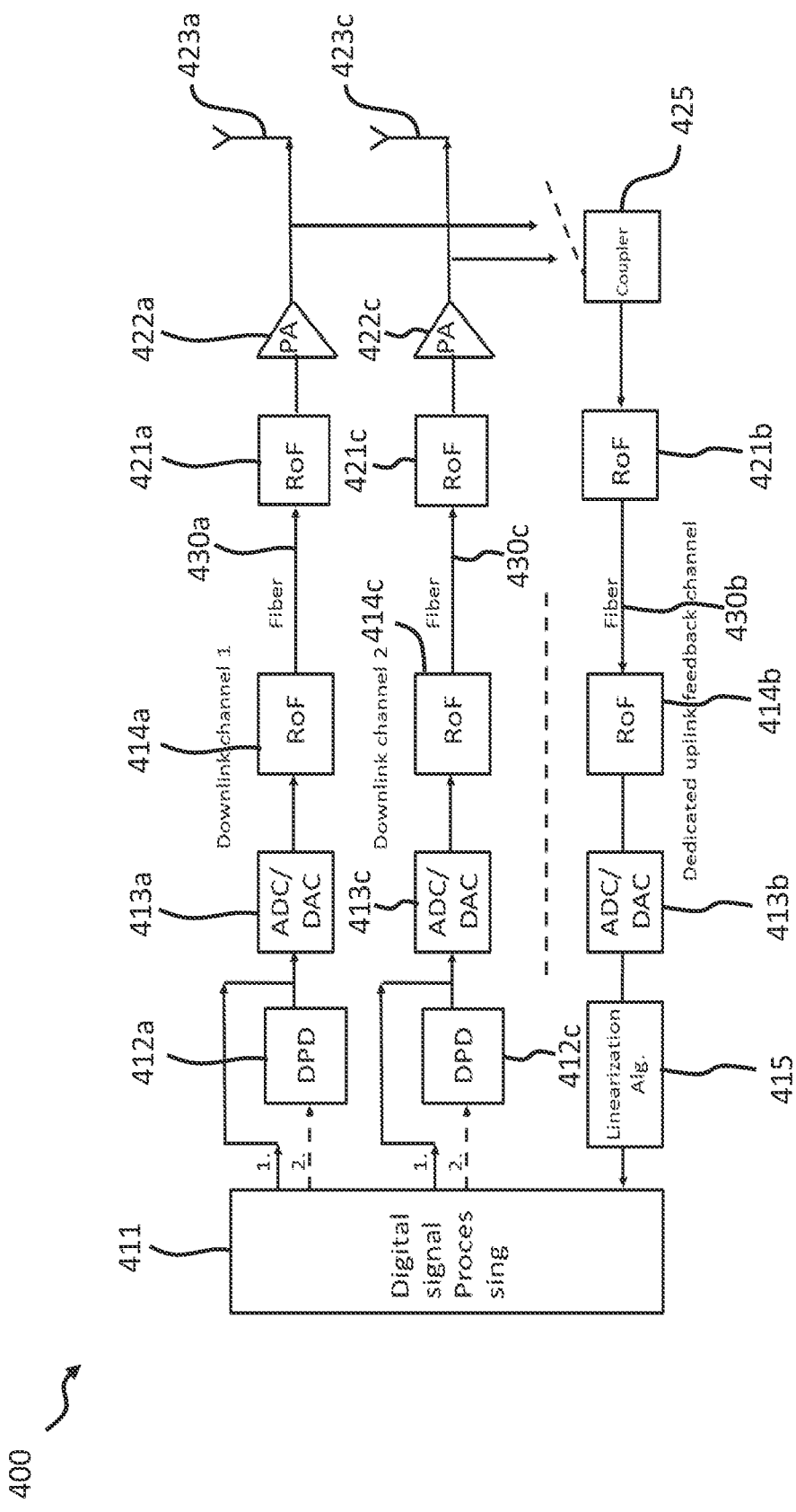
FIG. 8 shows a schematic diagram illustrating a base station according to an embodiment.

FIG. 8 illustrates (similar to FIG. 6) in more detail an embodiment of how the uplink feedback signal may be used by the central unit 410 of the base station 400 for reducing non-linear distortions for more than one downlink transmission channel, namely the downlink transmission channels 430a, 430c. As illustrated in FIG. 8, each downlink transmission channel 430a, 430c may be connected to the dedicated uplink feedback channel 430b separately by the coupler 425, which, as already mentioned above, acts as kind of switch.

As already described above in the context of FIG. 7, for each downlink transmission channel 430a, 430c there can be a two-stage process. In a first stage, the training signal skips the adjustable pre-distorter 412a, 412c implementing a pre-distortion filter, goes through the ADC/DAC unit 413a, 413c, the RoF interface 414a, 414c, the optical transmission fiber 430a. 430c, the RoF interface 421a, 421c, the PA 422a, 422c, and is feedback into the coupler 425, which may be configured to control the power, i.e. signal strength thereof. In the dedicated uplink feedback channel 430b the signal provided by the coupler 425 goes through the RoF interface 421b, the dedicated uplink feedback channel 430b, the RoF interface 414b, the ADC/DAC unit 413b and the linearization unit 415 for making the system linear. In a second stage, the digital signal processing circuitry provides the corresponding system, i.e. channel model to the adjustable pre-distorter 412a, 412c, which can use it to compensate non-linearity in downlink channel.

Figure 9:
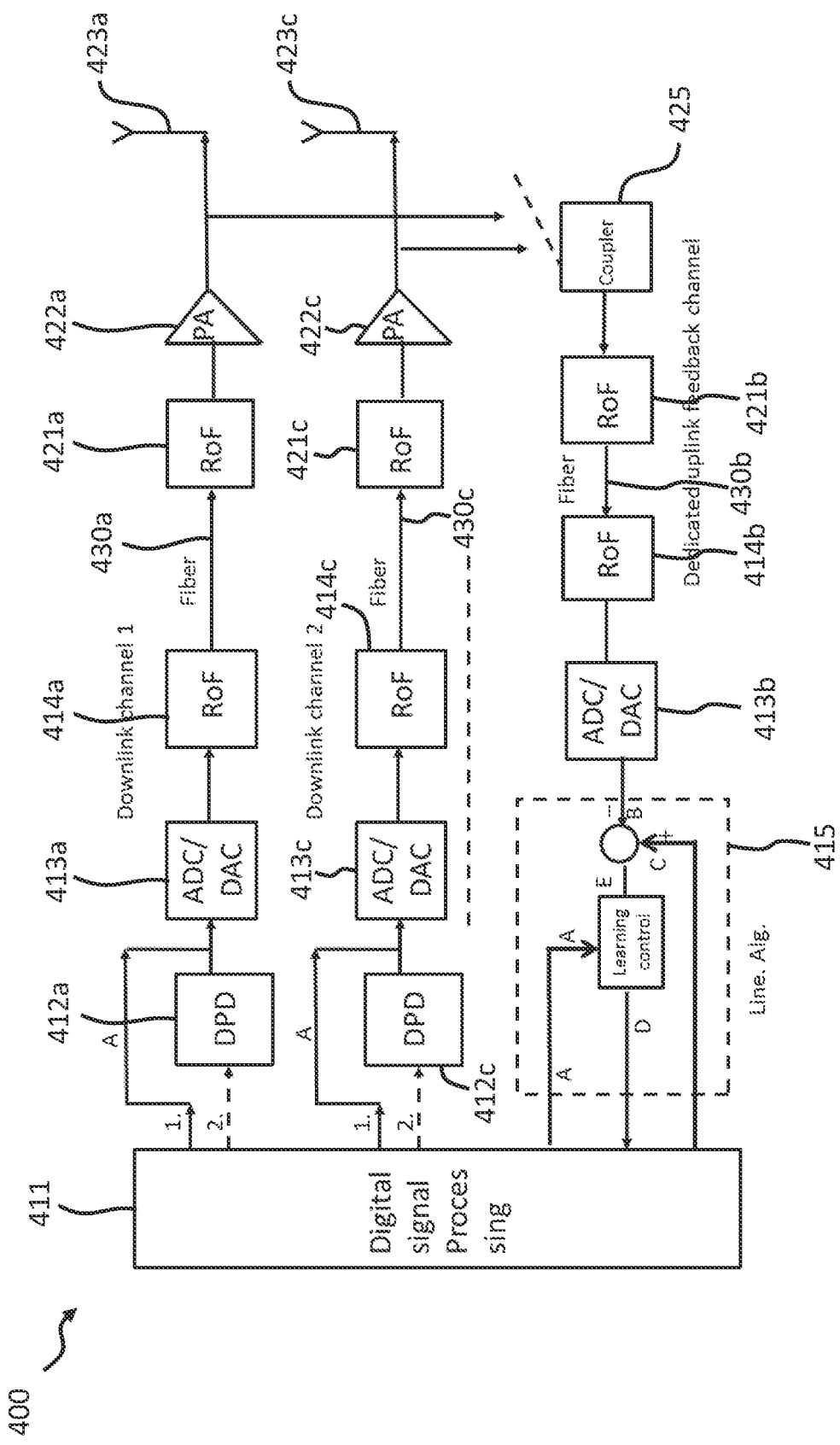
FIG. 9 shows a schematic diagram illustrating a base station according to an embodiment.

FIG. 9 illustrates (similar to FIG. 7) in more detail an embodiment how the unit 415 implementing the linearization algorithm can provide for further linearization for more than one downlink transmission channel, namely the downlink transmission channels 430a, 430c. As already described above in the context of FIG. 7, in a first stage, the linearization algorithm may be used to obtain the feedback signal provided via the dedicated uplink feedback channel 430b. In this initial step, the input signal A and C can be the same, and C remains unchanged. After several iterations, the system output can be close to linear or quasi-linear.

Figure 10:
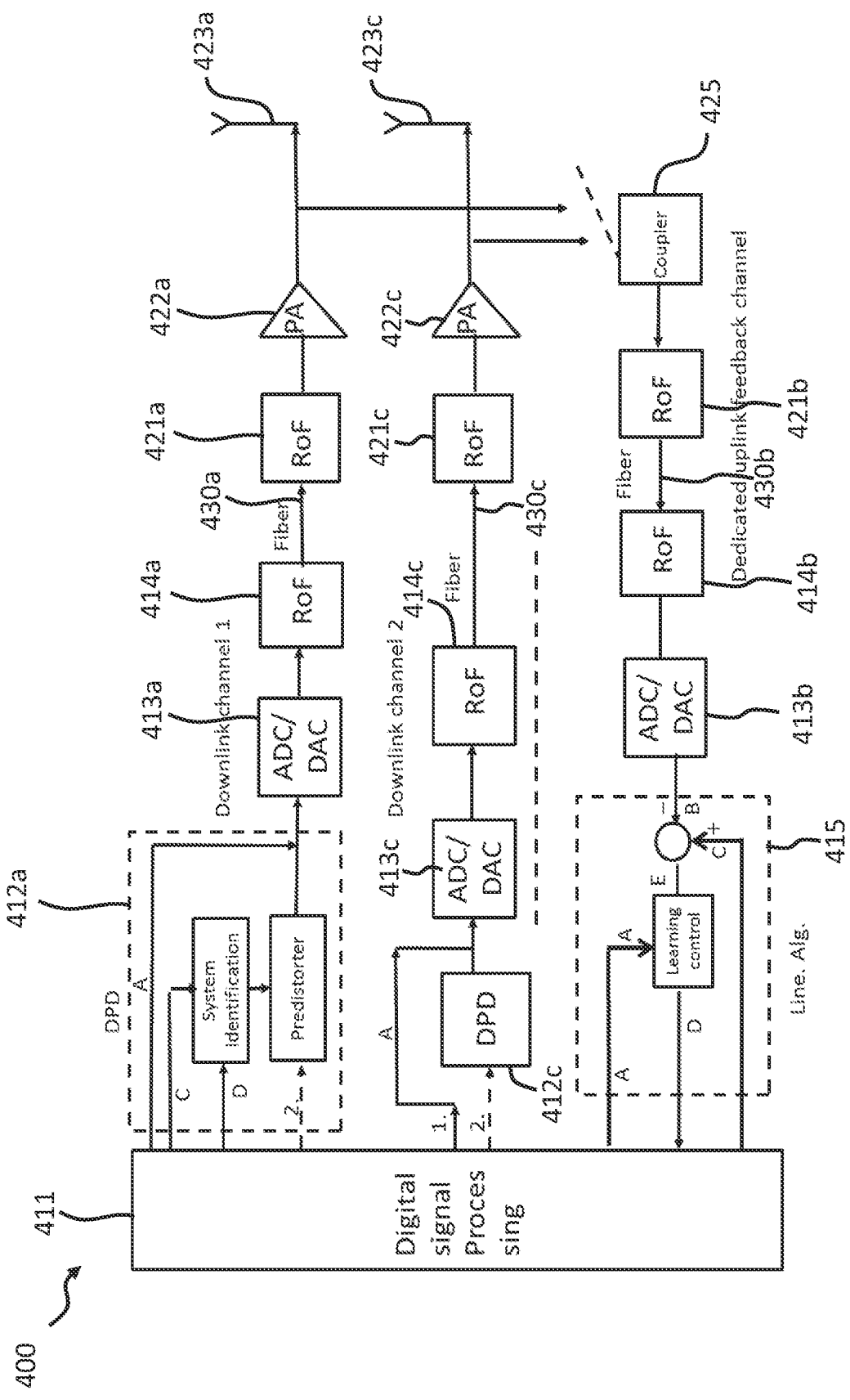
FIG. 10 shows a schematic diagram illustrating a base station according to an embodiment.

FIG. 10 shows in more detail how according to an embodiment the output D of the unit 415 implementing the linearization algorithm is used by the exemplary digital pre-distorter 412a for reducing non-linear distortions of the downlink transmission signal induced by the optical transmission fiber 430a, i.e. the downlink transmission channel 430a. More specifically, FIG. 10 illustrates how the digital pre-distorter 412a can use the linearization results provided by the unit 415 to determine a suitable system, i.e. channel model. To this end, the digital pre-distorter 412a can comprise a system identification unit, which may use the ideal input signal C and the iteration signal D to determine a system model. According to an embodiment, the system model is the general polynomial model (GPM) disclosed in Atso Hekkala, Mikko Hiivala, Mika Lasanen, Jari Perttu, Luis C. Vieira, Nathan J. Gomes, and Anthony Nkansah. "Predistortion of Radio Over Fiber Links: Algorithms. Implementation, and Measurements", IEEE TRANSACTIONS ON CIRCUITS AND SYSTEMS—I: REGULAR PAPERS, VOL. 59, NO. 3, MARCH 2012. PP 672-674, which is fully incorporated by reference herein. In a second stage illustrated in FIG. 10, the system model determined in this way may be provided from the digital signal processing circuitry 411 to the digital pre-distorter 412a.

For a conventional base station with a 200 MHz bandwidth OFDM signal and a 20 km length fiber the performance of the ACPR (Adjacent Channel Power Ratio) will be −37 dBc after downlink transmission. Embodiments of the invention allow to improve this performance to −46 dBc. The EVM (Error Vector Magnitude) reduces from 8% to 2.2% after applying the linearization algorithm provided by embodiments of the invention.

Figure 11:
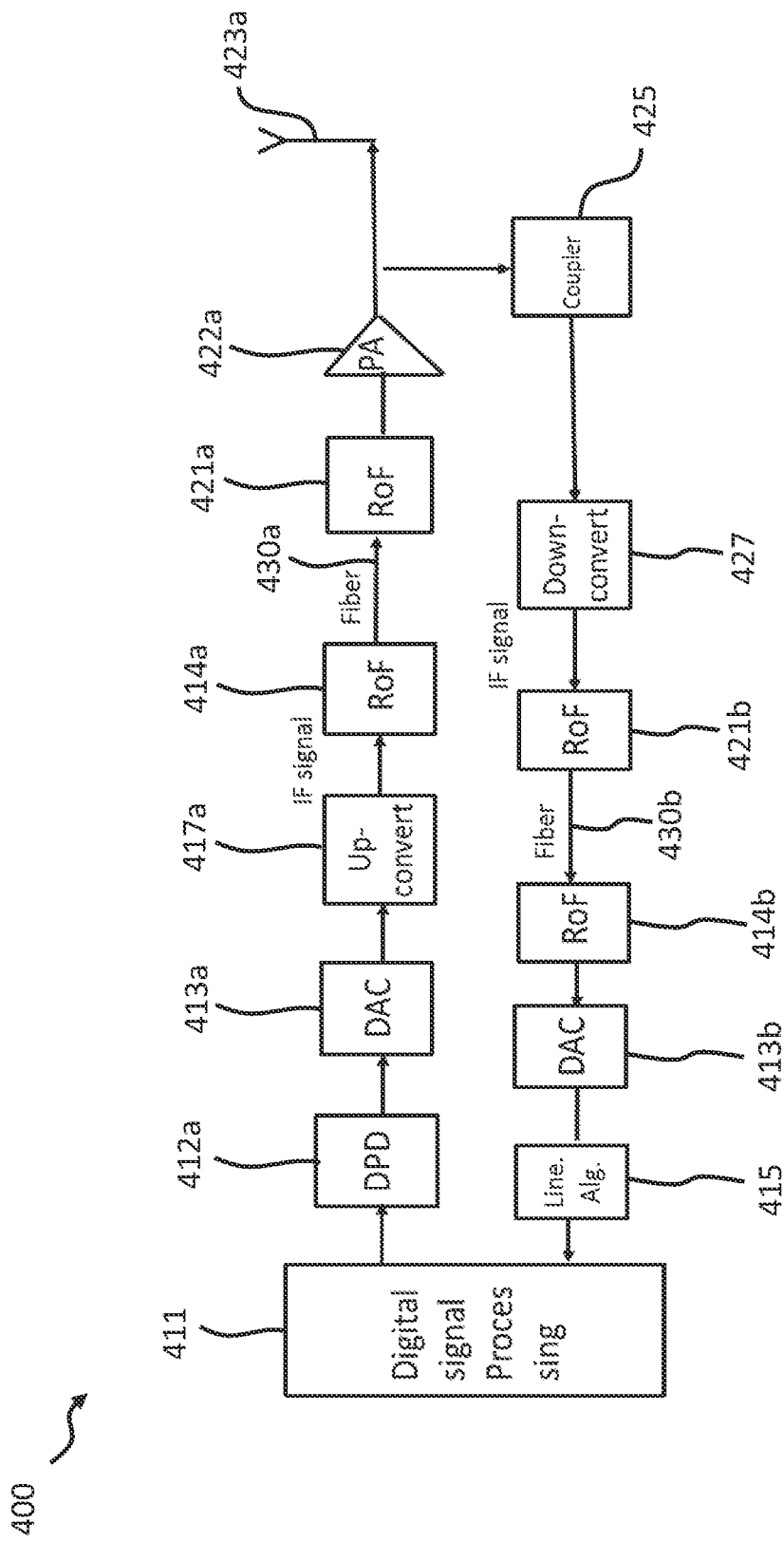
FIG. 11 shows a schematic diagram illustrating a base station according to an embodiment.

FIG. 11 (similar to FIG. 5) illustrates a further embodiment of the base station 400, wherein the base station 400 further comprises the frequency converter 427 configured to frequency down-convert the uplink feedback signal to an intermediate frequency (IF). As illustrated in FIG. 11, the frequency convertor 427 may be located between the coupler 425 and the RoF interface 421b of the dedicated uplink feedback channel 430b. This is advantageous, because the origin of RoF nonlinearity has been identified as the coupling of laser chirp with fiber dispersion, namely the CSO (Composite Second-Order) Distortion, which becomes worse with increasing frequency. Thus, according to embodiments of the invention, an IF (Intermediate Frequency) down-conversion is done at the RRU side and the IF signal is feedback to the central unit 410, as illustrated in FIG. 11.

For a wireless transmission system, the baseband signal is processed in the digital domain, and then a DAC is performed to obtain the analog signal. According to an embodiment, the base station 400 further comprises an up-convert unit 417a for modulating this analog signal by a carrier, which has a much higher frequency (also referred to as "up-convert frequency"). In a 5G massive MIMO system, this carrier frequency could be 3.5 GHz, which is the frequency to transmit the signal by the antenna 423a. However, according to an embodiment, this up-converted frequency can just be used to determine the system model and the linearization and it is possible to use an intermediate carrier frequency to modulate the signal. The benefit is to have better linearity.

Figure 12:
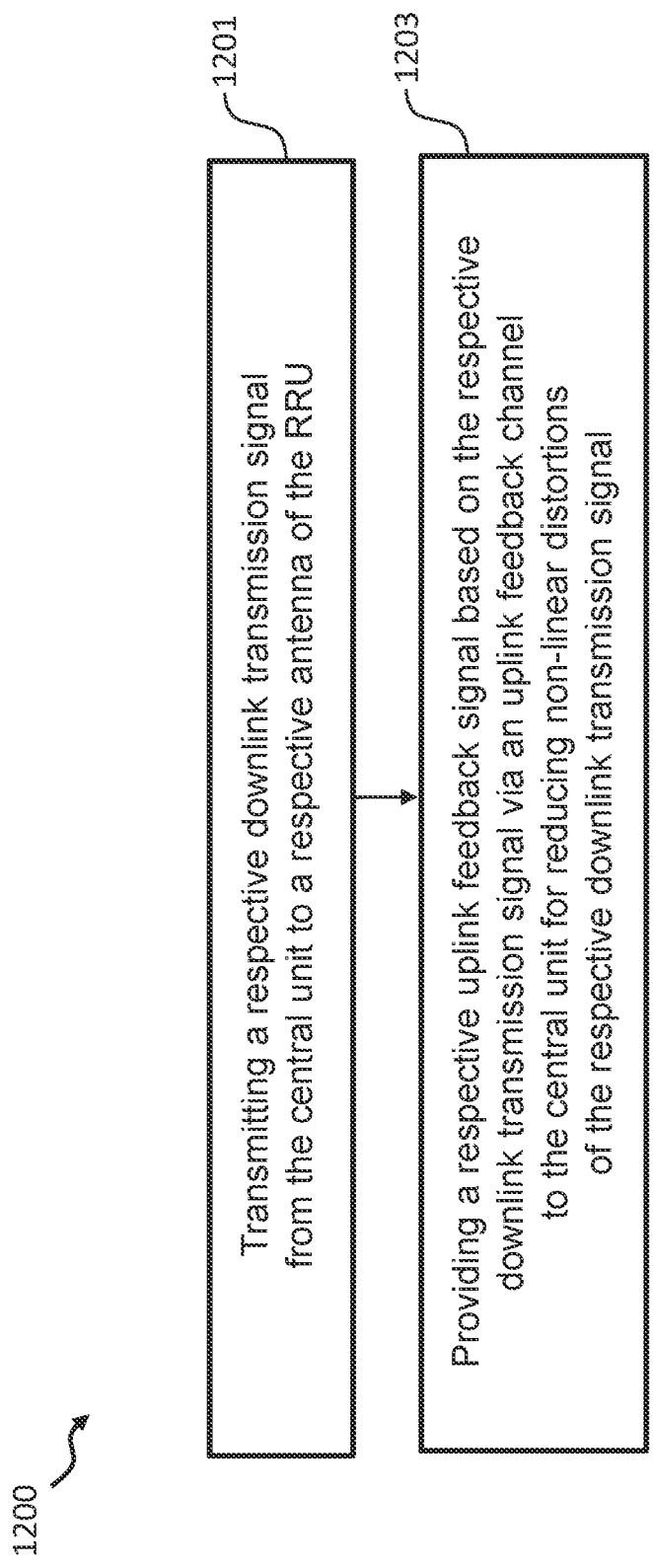
FIG. 12 shows a schematic diagram illustrating a method of operating a base station according to an embodiment.

FIG. 12 illustrates a corresponding method 1200. The method 1200 comprises the steps of: transmitting 1201 a respective downlink transmission signal from the central unit 410 to the respective antenna 423a, 423c of the RRU 420; and providing 1203 a respective uplink feedback signal based on the respective downlink transmission signal via an uplink feedback channel 430b to the central unit 410 for reducing non-linear distortions of the respective downlink transmission signal.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labelling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A base station, comprising:
   a central unit; and
   a remote radio unit (RRU), comprising:
      a plurality of antennas, wherein
      the RRU is coupled to the central unit via a plurality of optical transmission fibers, wherein
         each optical transmission fiber of the plurality of optical transmission fibers defines a respective downlink transmission channel for transmitting a respective downlink transmission signal from the central unit to a respective antenna of the plurality of antennas of the RRU,
         wherein the RRU is configured to provide a respective uplink feedback signal via an uplink feedback channel to the central unit for reducing non-linear distortions of the respective downlink transmission signal, wherein the respective uplink feedback signal is based on the respective downlink transmission signal,
      the RRU comprising a coupler configured to couple, selectively, the respective downlink transmission channels with the uplink feedback channel for providing the respective uplink feedback signal via the uplink feedback channel to the central unit.

2. The base station of claim 1, wherein the central unit comprises an adjustable pre-distorter configured to pre-distort the respective downlink transmission signal to be transmitted to the respective antenna of the RRU based on the respective uplink feedback signal.

3. The base station of claim 2, wherein the central unit is configured to:
   transmit a respective training signal via the respective downlink transmission channel to the respective antenna of the RRU; and
   adjust the adjustable pre-distorter based on the respective uplink feedback signal, wherein the respective uplink feedback signal is based on the respective training signal.

4. The base station of claim 3, wherein the central unit is further configured to adjust the adjustable pre-distorter using an iterative adjustment scheme.

5. The base station of claim 1, wherein the base station is configured to operate the uplink feedback channel in linear regime.

6. The base station of claim 1, wherein the RRU is further configured to reduce a signal strength of the respective uplink feedback signal.

7. The base station of claim 1, wherein the base station further comprises a frequency converter, wherein the frequency converter is configured to frequency down-convert the respective uplink feedback signal.

8. The base station of claim 1, wherein the central unit further comprises a digital-to-analog converter for converting the respective downlink transmission signal to be transmitted to the respective antenna of the RRU from a digital domain to an analog domain.

9. The base station of claim 1, wherein the RRU further comprises for each antenna of the plurality of antennas a power amplifier configured to amplify the respective downlink transmission signal received from the central unit.

10. The base station of claim 1, wherein the optical transmission fiber defines the respective downlink transmission channel and the uplink feedback channel between the RRU and the central unit.

11. The base station of claim 1, wherein each respective one of the optical transmission fibers further defines an uplink transmission channel between the RRU and the central unit.

12. The base station of claim 1, wherein the base station comprises a further optical transmission fiber defining the uplink feedback channel between the RRU and the central unit.

13. A method of operating a base station for a wireless communication network, the base station comprising: a central unit; and a remote radio unit (RRU) comprising a plurality of antennas, wherein the RRU is coupled to the central unit via a plurality of optical transmission fibers, wherein each optical transmission fiber of the plurality of optical transmission fibers defines a respective downlink transmission channel, the RRU comprising a coupler configured to couple, selectively, the respective downlink transmission channels with the uplink feedback channel,
wherein the method comprises:
transmitting a respective downlink transmission signal from a respective one of the downlink transmission channels to a respective antenna of the plurality of antennas of the RRU;
selectively coupling, via the coupler, the respective one of the downlink transmission channels with the uplink feedback channel; and
providing a respective uplink feedback signal based on the respective downlink transmission signal via the uplink feedback channel to the central unit for reducing non-linear distortions of the respective downlink transmission signal.

14. A system comprising a base station for a wireless communication network, the base station comprising:
a central unit;
a remote radio unit (RRU), comprising:
a plurality of antennas, wherein
the RRU is coupled to the central unit via a plurality of optical transmission fibers, wherein
each optical transmission fiber of the plurality of optical transmission fibers defines a respective downlink transmission channel,
the RRU comprising a coupler configured to couple, selectively, the respective downlink transmission channels with the uplink feedback channel; and
one or more tangible, non-transitory, computer-readable media storing instructions that, when executed by a processor of the base station, cause operations to be performed comprising:
transmitting a respective downlink transmission signal from a respective one of the downlink transmission channels to a respective antenna of the plurality of antennas of the RRU;
selectively coupling, via the coupler, the respective one of the downlink transmission channels with the uplink feedback channel; and
providing a respective uplink feedback signal based on the respective downlink transmission signal via the uplink feedback channel to the central unit for reducing non-linear distortions of the respective downlink transmission signal.

* * * * *